United States Patent [19]

Ichihara

[11] Patent Number: 5,331,230
[45] Date of Patent: Jul. 19, 1994

[54] INTEGRATED-CIRCUIT SAMPLED-AND-HOLD PHASE DETECTOR WITH INTEGRATED CURRENT SETTING RESISTOR

[75] Inventor: Masaki Ichihara, Tokyo, Japan

[73] Assignee: Nec Corporation, Tokyo, Japan

[21] Appl. No.: 923,541

[22] Filed: Aug. 3, 1992

[30] Foreign Application Priority Data

Aug. 2, 1991 [JP] Japan .................................. 3-216425

[51] Int. Cl.⁵ .............................................. H03K 5/26
[52] U.S. Cl. .................................. 307/514; 307/353; 328/133; 328/155
[58] Field of Search ............... 307/262, 514, 516, 353; 328/133, 155

[56] References Cited

U.S. PATENT DOCUMENTS

| | | | |
|---|---|---|---|
| 4,866,368 | 9/1989 | Bird | 307/353 |
| 5,034,633 | 7/1991 | Stekelenburg | 307/353 |
| 5,103,123 | 4/1992 | McGinn | 307/514 |
| 5,157,341 | 10/1992 | Fobbester et al. | 307/514 |
| 5,179,301 | 1/1993 | Hughes | 307/353 |
| 5,227,676 | 7/1993 | Bahr et al. | 307/353 |

*Primary Examiner*—Willis R. Wolfe
*Attorney, Agent, or Firm*—Sughrue, Mion, Zinn, Macpeak & Seas

[57] ABSTRACT

A sample-and-hold phase detector comprises a first charge/discharge circuit for charging a first storage capacitor with a constant current for a duration corresponding to a phase difference between an input pulse and a reference pulse and discharging it after it is sampled. A first sample-and-hold circuit samples the voltage developed in the first storage capacitor to represent the phase difference between the input pulse and the reference pulse. A second charge/discharge circuit periodically charges a second storage capacitor with a constant current for a fixed time interval and discharging it after it is sampled. A second sample-and-hold circuit samples the voltage developed in the second storage capacitor. A current setting circuit, in which a current setting resistor is provided, is connected to both charge/discharge circuits to determine their constant charging currents. A differential integrator provides differential integration on the voltage from the second sample-and-hold circuit with respect to a reference voltage to control the current setting circuit in a feedback loop.

7 Claims, 4 Drawing Sheets

INTEGRATED-CIRCUIT SAMPLED-AND-HOLD PHASE DETECTOR WITH INTEGRATED CURRENT SETTING RESISTOR

BACKGROUND OF THE INVENTION

The present invention relates to a sample-and-hold phase detector.

As illustrated in FIG. 1, a prior-art sample-and-hold phase detector comprises a current setting circuit 18 formed by a current setting resistor 13 (with value $R_B$) which is externally connected through a terminal 12 to a PNP transistor 11. The reason for the external connection of resistor 13 will be given later. Since the voltage impressed on resistor 13 is equal to voltage $V_{CC}$ minus the base-emitter voltage $V_{BE}$ of transistor 11, an input current $I_B$ flowing through the setting resistor 13 is given by:

$$I_B = (V_{CC} - V_{BE})/R_B \quad (1)$$

The base of PNP transistor 11 is connected by a line 10 to the base of a PNP transistor 8 to form a current mirror circuit. The collector current $I_c$ of transistor 8 is given by:

$$I_C = I_B \cdot W_8 / W_{11} \quad (2)$$

where $W_8$ and $W_{11}$ represent the emitter sizes of transistors 8 and 11, respectively. Transistor 8 acts as a constant current source to supply current according to a current setting signal applied to line 10 and resistor 13 acts as a first reference voltage circuit to provide a prescribed voltage corresponding to the current $I_B$, while transistor 11 acts as a second reference voltage circuit that is responsive to that prescribed voltage to apply the current setting signal to line 10. The collector of transistor 8 is coupled through an analog switch 7 to a circuit junction 9 which is in turn connected through a storage capacitor 4 to ground, with the capacitor 4 being connected in parallel with an analog switch 6. The circuit junction 9 is further connected by an analog switch 5 to a buffer amplifier 2 whose input is also connected to ground by a capacitor 3. The output of buffer amplifier 2 is connected to the output terminal 1 of the phase detector. Amplifier 2, capacitor 3 (with value $C_H$) and switch 5 constitute a sample-and-hold circuit. Each of the capacitors 3 and 4 is formed by an externally provided capacitor. The phase detector includes a switching circuit 17 which receives a phase reference signal (REF) from terminal 15 and an input signal from terminal 16 to generate switching signals SA, SB and SC to supply them respectively to switches 7, 6 and 5 by using a clock signal from terminal 14.

The operation of the prior art phase detector will be given below with reference to the timing diagram of FIG. 2. The input signal has an interval T seconds between successive pulses and the reference signal REF has a pulse whose leading edge is delayed by a phase difference $\theta$ with respect to the leading edge of the input signal and whose trailing edge occurs prior to the leading edge of the next pulse of the input signal. The switching pulse SA occurs during a period corresponding to the phase difference $\theta$ for operating the analog switch 7. Storage capacitor 4 is charged with a collector current supplied from transistor 8 when switch 7 is closed in response to a switching pulse SA. Capacitor 4, having a capacitance value $C_R$, develops a voltage $V_{CR}$ which increases linearly with time from the leading edge of signal SIG to a maximum voltage V given by:

$$V = I_C \cdot \theta \cdot T / 2\pi \cdot C_R \quad (3)$$

Substituting Equations (1) and (2) into Equation (3) gives:

$$V = \theta \cdot T \cdot W_8 (V_{CC} - V_{BE})/(2\pi \cdot W_{11}) \quad (4)$$
$$= k \cdot \theta / (R_B \cdot C_R)$$

$$k = T \cdot W_8 (V_{CC} - V_{BE})/(2\pi \cdot W_{11}) \quad (5)$$

Switching pulse SC is a constant-duration pulse that occurs a predetermined time following the leading edge of the switching pulse SA so that switch 5 is closed briefly to transfer energy from capacitor 4 to capacitor 3 when switches 6 and 7 are in a turn-off state, whereby the voltage V is sampled by the switching pulse SC to produce a sampled voltage V'. If capacitor 3 has a sufficiently smaller capacitance value than that of capacitor 4, the sampled voltage V' is substantially equal to voltage V. The sampled voltage in capacitor 3 is delivered through buffer amplifier 2 to the output terminal 1 to indicate the phase difference between reference signal REF and input signal. The switching pulse SB occurs following the pulse SC to turn on switch 6 during the interval between a pulse SC and a pulse SA to discharge the storage capacitor 4 completely. From Equation (4), the phase-to-voltage conversion coefficient K of the prior art sample-and-hold phase detector is:

$$K = V/\theta = k/(C_R \cdot R_B) \quad (6)$$

If a sample-and-hold phase detector is implemented using LSI (large scale integration) technology by integrating all resistors and capacitors, it is difficult to provide a precision phase detector due to large variabilities of resistance and capacitance values, typically ±30% deviations from the rated value. Thus, for LSI implemented phase comparators, resistor 13 and capacitors 3, 4 are provided by elements located outside of the LSI chip to ensure a high level of precision.

It is desirable, however, to reduce the number of external connections since the number of terminals available in an LSI chip is severely limited. It is further desirable from the noise view point that the values of capacitors 3 and 4 be as large as possible while the value of current setting resistor 13 be as small as possible. However, this results in an increase in currents $I_B$ and $I_C$ as seen from Equations (1) and (2).

SUMMARY OF THE INVENTION

It is therefore an object of the present invention to provide a sample-and-hold phase detector which eliminates the need to provide externally connected resistor.

According to the present invention, the phase detector comprises a first storage capacitor and a first charge/discharge circuit for charging the first storage capacitor with a first constant current for a duration corresponding to a phase difference between an input pulse and a reference pulse and discharging it after it is sampled. A first sample-and-hold circuit samples the voltage developed in the first storage capacitor to represent the phase difference between the input pulse and the reference pulse. A second charge/discharge circuit periodically charges a second storage capacitor with a second constant current for a fixed time interval and discharging it after it is sampled. A second sample-and-hold circuit samples the voltage developed in the second storage capacitor. A current setting circuit including a resistive element is connected to the first and second charge/discharge circuits to determine the first and second constant currents. A differential integrator provides differential integration on the voltage sampled by the second sample-and-hold circuit with respect to a reference voltage and controls the current setting circuit with the differentially integrated voltage in a feedback loop.

BRIEF DESCRIPTION OF THE DRAWINGS

The present invention will be described in further detail with reference to the accompanying drawings, in which.

DETAILED DESCRIPTION

Figure 1:
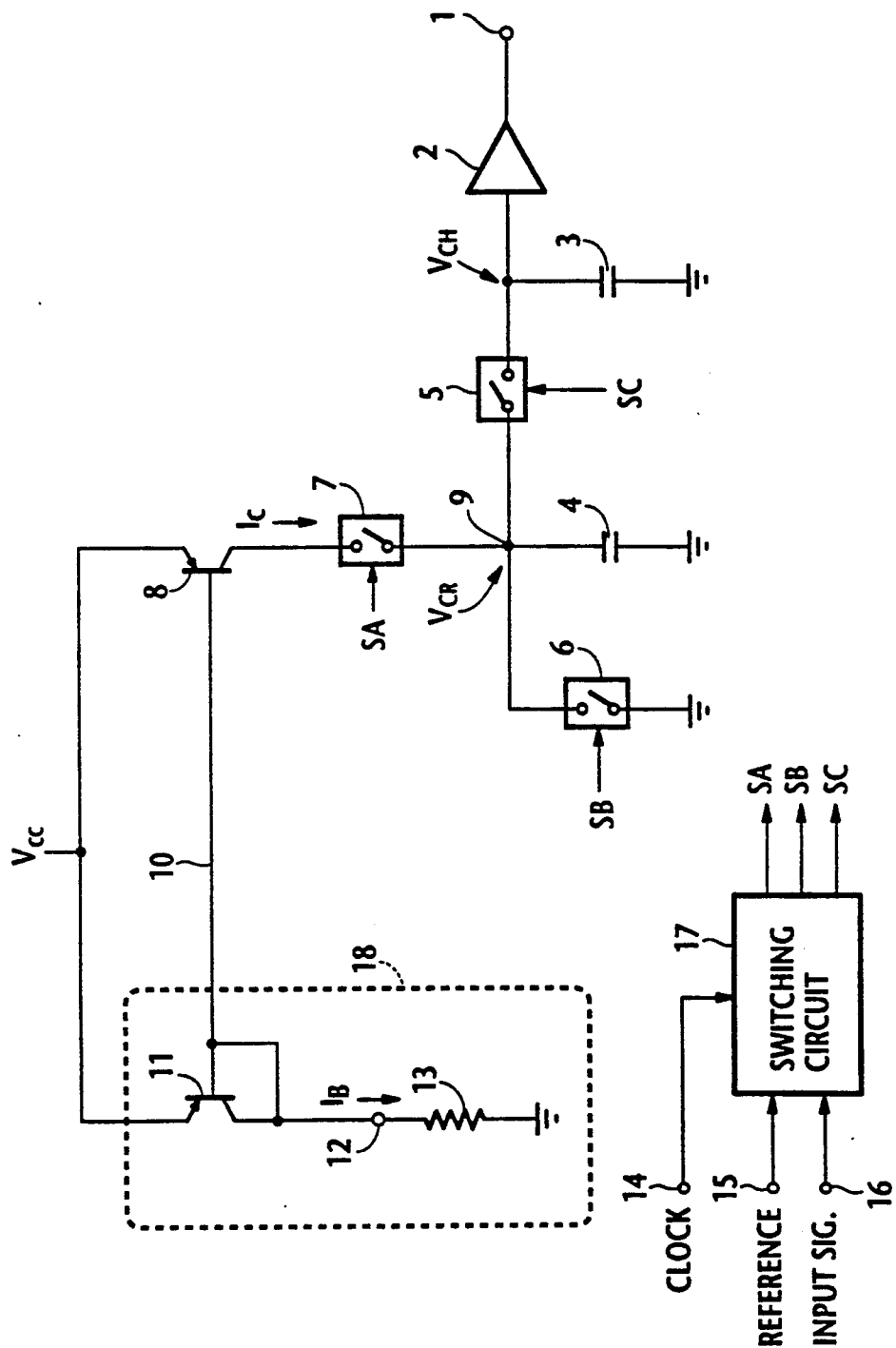
FIG. 1 is a circuit diagram of a prior art sample-and-hold phase detector.
Figure 2:
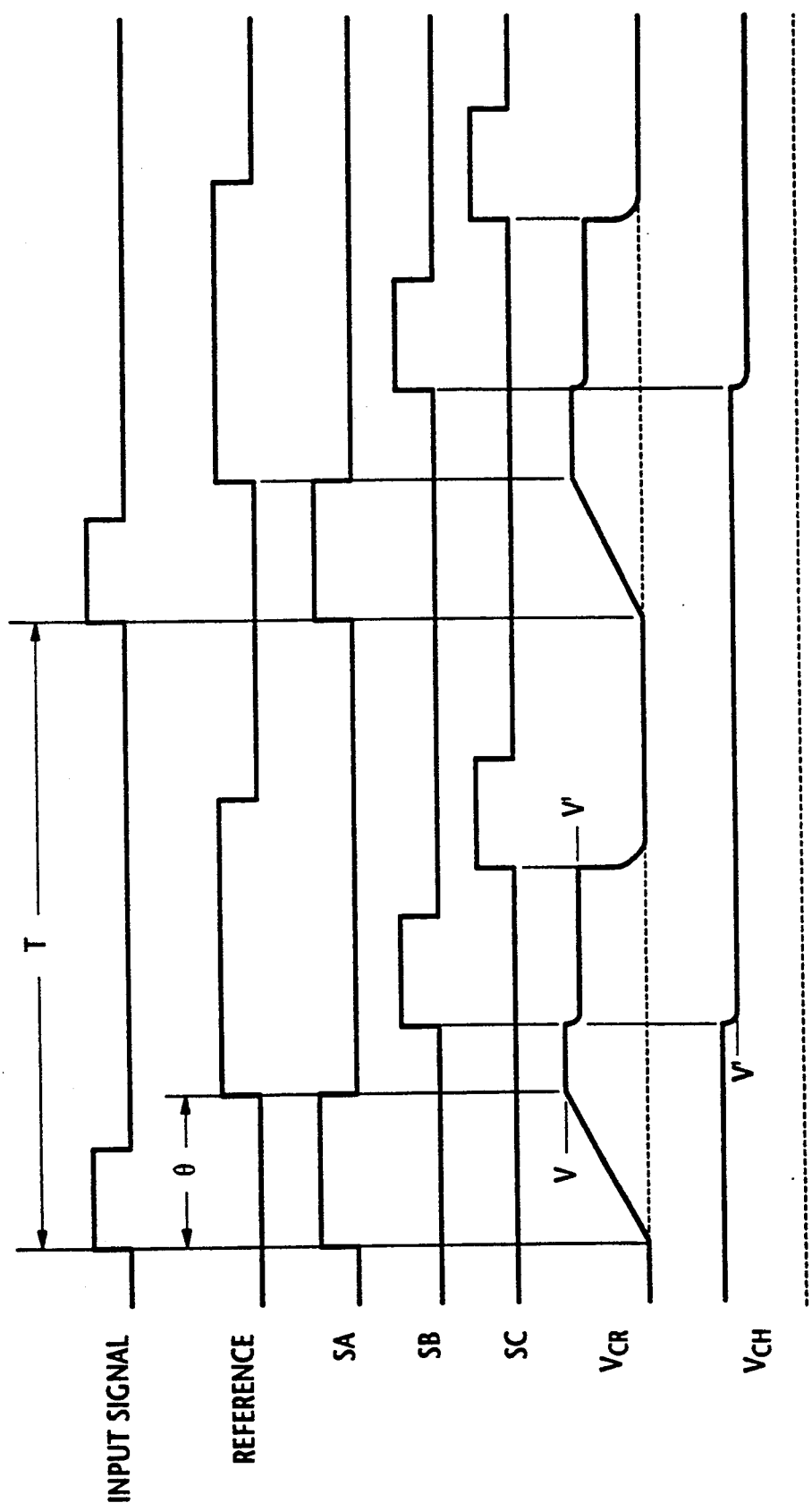
FIG. 2 is a timing diagram associated with the prior art phase detector.
Figure 3:
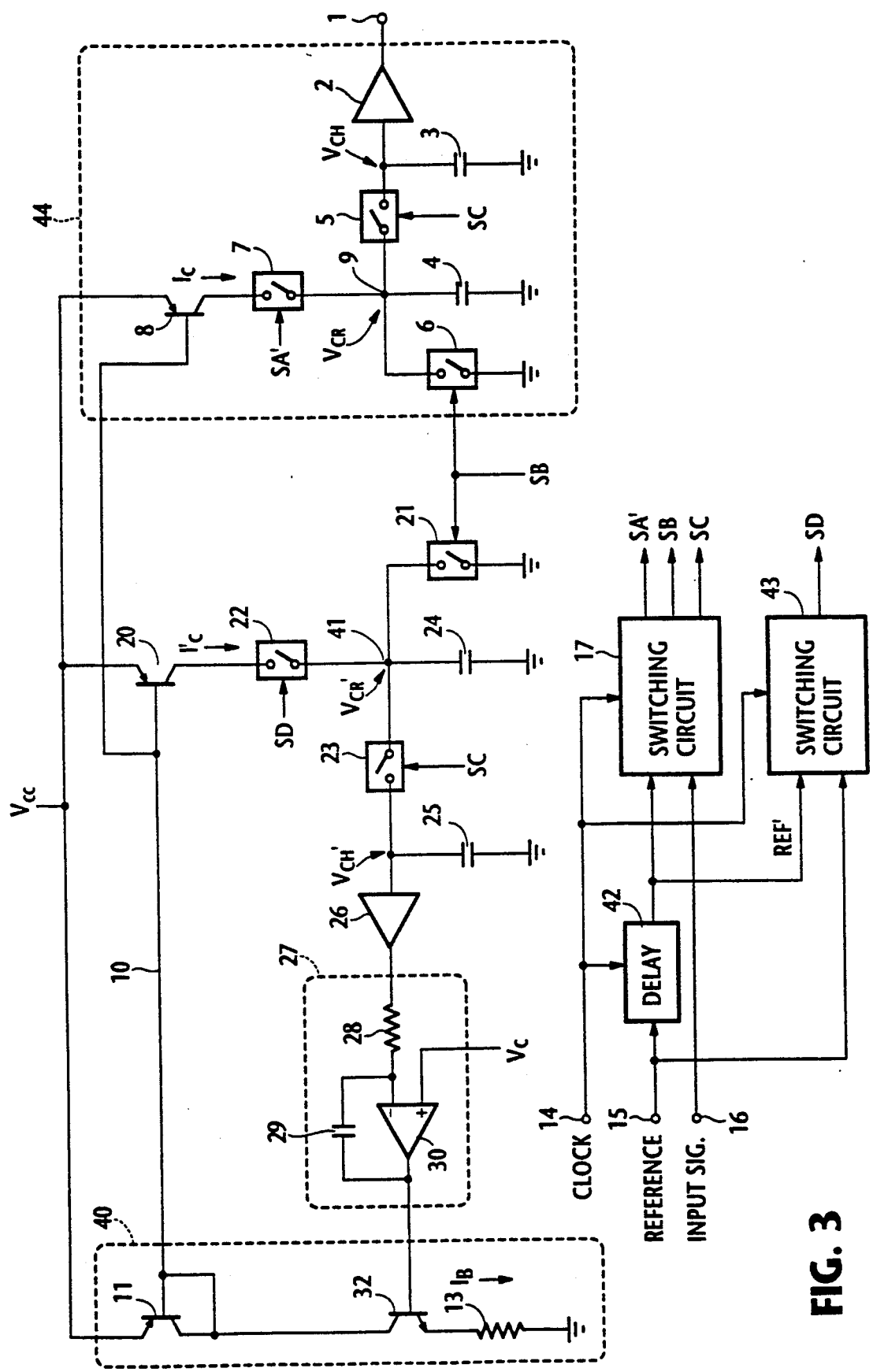
FIG. 3 is a circuit diagram of a sample-and-hold phase detector of the present invention.

Referring now to FIG. 3, there is shown a sample-and-hold phase detector of the present invention which eliminates the need for external connections for resistance and capacitance elements. The phase detector of this invention comprises an NPN transistor 32 which is provided in a current setting circuit 40, the collector of transistor 32 being connected to the collector of transistor 11 and the emitter thereof being connected to a current setting resistor 13 having the value $R_B$. To the base of transistor 32 is connected an integrator 27 formed by a resistor 28, a capacitor 29 and an operational amplifier 30 whose positive input is supplied with a voltage $V_C = V_{CC}/2$.

According to the present invention, the transistor 8 acts as a first constant current source. A second constant current source is provided by a PNP transistor 20 whose emitter is connected to voltage supply $V_{CC}$ and whose base is connected to the bases of both transistors 8 and 11. A current mirror circuit is therefore formed between transistors 20 and 11 in a manner similar to that between transistors 8 and 11. Transistor 20 produces a collector current $I_C'$ corresponding to the current control signal on line 10. The collector current $I_C'$ is given by:

$$I_C' = I_B \cdot W_{20}/W_{11} \quad (7)$$

where, $W_{20}$ represents the emitter size of transistor 20.

The collector of transistor 20 is connected through an analog switch 22 to a circuit junction 41, which is grounded by a parallel circuit formed by an analog switch 21 and a storage capacitor 24 with a capacitance value $C_R'$. Circuit junction 41 is further connected by a sampling switch 23 to a buffer amplifier 26 whose output is connected to the input of integrator 27. A sampling capacitor 25 is connected to the input of buffer amplifier 26, which forms a sample-and-hold circuit with capacitor 25 and switch 23. Switches 21 and 23 are driven by pulses SB and SC, respectively.

Figure 4:
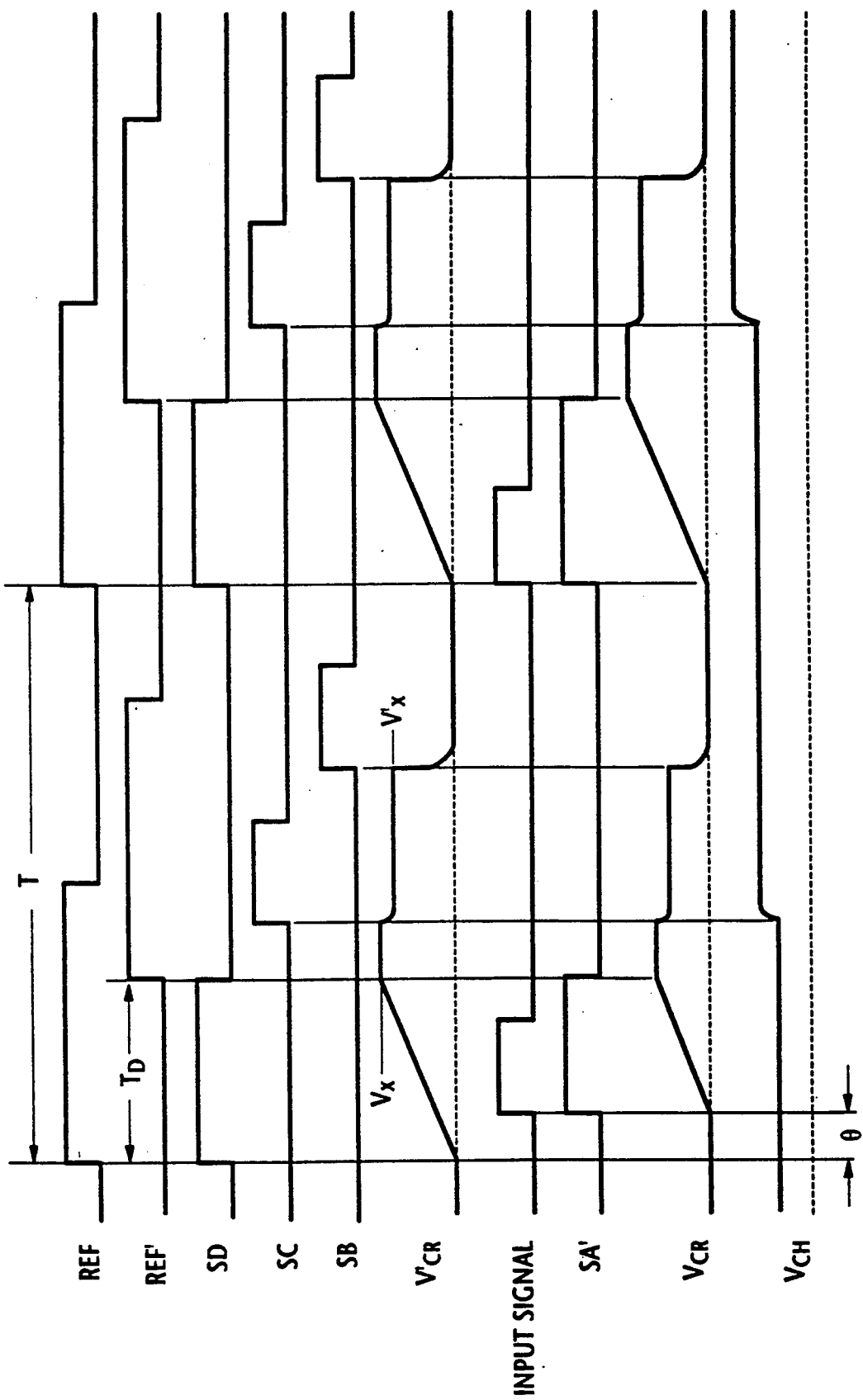
FIG. 4 is a timing diagram of the phase detector of this invention.

A delay circuit 42 is connected between terminal 15 and switching circuit 17 to produce a delayed reference signal REF' which is delayed by interval $T_D$ with respect to reference pulse REF so that, instead of the pulse SA, switching circuit 17 produces a switching pulse SA' having a duration corresponding to the delay time $T_D - \theta$ which lasts from the leading edge of an input signal pulse to the leading edge of the delayed reference pulse REF' as shown in FIG. 4. In addition, a second switching circuit 43 is connected to receive the delayed reference pulse REF' and the non-delayed reference pulse REF to supply a switching pulse SD to switch 22. This switching pulse SD is present during the interval from the leading edge of the reference pulse REF and the leading edge of the delayed reference pulse REF'.

Storage capacitor 24 is charged with the collector current $I_C'$ when analog switch 22 is turned on in response to switching pulse SD to develop a voltage $V_{CR}'$ which varies linearly with time as shown in FIG. 4 until it reaches the following maximum value $V_X$:

$$V_X = T_D \cdot I_B \cdot W_{20}/(W_{11} \cdot C_R') \quad (8)$$

The voltage developed in storage capacitor 24 is sampled by switch 23 in response to a switching pulse SC and stored into capacitor 25 to produce a sampled voltage $V_X'$ which is coupled through amplifier 26 to integrator 27. The energy stored in capacitor 24 is discharged completely through switch 21 in response to a switching pulse SB.

The integrator 27 operates as a differential integrator to produce the following output $V_Y$ by integrating the difference between the sampled voltage $V_X'$ and the reference voltage $V_C$:

$$V_Y = \frac{1}{C \cdot R} \int^t (V_C - V_X) dt \quad (9)$$

where C and R are the values of integrating capacitor 29 and resistor 28, respectively. This differentially integrated voltage $V_Y$ drives the base of transistor 32. In this way, the current $I_B$ passing through resistor 13 is:

$$I_B = (V_Y - V_{BE})/R_B \quad (10)$$

From Equation (8), the following relations hold:

$$I_{B0} = V_C \cdot W_{11} \cdot C_R'/(T_D \cdot W_{20}) \quad (11)$$

$$I_B = I_{B0} + \Delta I_B \quad (12)$$

where $I_{B0}$ is the value of current $I_B$ if the sampled voltage $V_X'$ is made equal to reference voltage $V_C$, and $\Delta I_B$ is the difference between $I_B$ and $I_{B0}$.

Substituting Equations (11) and (12) into Equations (9) and (10) and differentiating Equations (9) and (10) result in the following relation:

$$d\Delta I_B/dt = -\Delta I_B/\tau \quad (13)$$

where $\tau$ is a time constant given by Equation (14):

$$\tau = R_B \cdot C \cdot R \cdot W_{11} C_R'/T_D \cdot W_{20} \quad (14)$$

Therefore, $\Delta I_B$ is given by Equation (15):

$$\Delta I_B = \Delta I_{B0} \cdot \exp(-t/\tau) \quad (15)$$

where $\Delta I_{B0}$ is an initial, arbitrary value.

It is seen that, while $\Delta I_B$ is of arbitrary value, it eventually converges to zero with the time constant $\tau$ and the current $I_B$ automatically adjusts itself through a closed loop feedback operation to the current value $I_{B0}$ given by Equation (11). Therefore, the difference between the voltage $V_X'$ and reference voltage $V_C$ is reduced substantially to zero. This indicates that variabilities of the value of resistor 13, which would result from the fabrication of resistive materials on LSI chips, are absorbed. Since the current $I_B$ determines the emitter current of transistor 8 and the charging current of capacitor 4, and hence it determines the phase-to-voltage conversion coefficient K of the sample-and-hold phase detector 44 formed by transistor 8, switches 5, 6 and 7, capacitors 3 and 4 and amplifier 2. This conversion coefficient is derived from Equations (1), (5), (6) and (11) as follows:

$$K = \frac{T \cdot W_8 \cdot C_R' \cdot V_C}{2\pi \cdot T_D \cdot W_{20} \cdot C_R} \quad (16)$$

The timing ratio $T/T_D$ can be precisely determined if the delay circuit 42 is implemented with a shift register and the ratios $W_8/W_{20}$ and $C_R'/C_R$ can also be determined precisely because transistors 8 and 20 and capacitors 4 and 24 are fabricated on the same LSI chip. Therefore, a precision phase-to-voltage conversion coefficient K can be established by the present invention. If transistors 8 and 20, capacitors 4 and 24, and capacitors 3 and 25 are fabricated identically to each other on an LSI chip, Equation (16) can be rewritten as follows:

$$K = V_C T/(2\pi \cdot T_D) \quad (17)$$

It is seen from the above description that resistor 13 can be integrated on a common LSI chip with other circuit components, using electrically resistive materials or fabricating a transistor circuit that generates a voltage corresponding to an input current. Since capacitors 4 and 24 contribute to the determination of the coefficient K as relative values of $C_R$ and $C_R'$, their absolute value can be reduced to advantage, allowing integration of these capacitors on the same LSI chip. The reduction of capacitor 4 results in a reduction in charging current and hence the power consumption can be reduced.

The foregoing description shows only one preferred embodiment of the present invention. Various modifications are apparent to those skilled in the art without departing from the scope of the present invention which is only limited by the appended claims. For example, instead of bipolar transistors, MOS transistors could equally be used as well.

What is claimed is:

1. A phase detector comprising:
   a first storage capacitor;
   first charge/discharge means for charging said first storage capacitor with a first constant current for a duration corresponding to a phase difference between an input pulse and a reference pulse and discharging said first storage capacitor;
   first sample-and-hold means for sampling a voltage developed in said first storage capacitor, said sampled voltage representing a phase difference between said input pulse and said reference pulse;
   a second storage capacitor;
   second charge/discharge means for charging said second storage capacitor with a second constant current for a fixed time interval and discharging said second storage capacitor;
   second sample-and-hold means for sampling a voltage developed in said second storage capacitor;
   current setting means, including current control means and a resistive element connected in series to the current control means, for producing a setting current through said resistive element, said current control means being connected to said first charge/discharge means and said second charge/discharge means for determining said first and second constant currents according to said setting current; and
   differential integrator means for differentially integrating the voltage sampled by said second sample-and-hold means with respect to a reference voltage and controlling the current control means of said current setting means in accordance with the differentially integrated voltage.

2. A phase detector as claimed in claim 1, wherein the current control means of said current setting means includes a first and a second transistor, and each of said first and second charge/discharge means includes a transistor, and wherein the transistors of the first and second charge/discharge means are connected in a current mirror relationship with the first transistor of the current setting means, said second transistor of the current setting means being connected to be responsive to said differentially integrated voltage.

3. A phase detector as claimed in claim 1, wherein said first and second sample-and-hold means operate simultaneously.

4. A phase detector as claimed in claim 1, wherein said second charge/discharge means includes means for deriving a second reference pulse delayed with respect to the first-mentioned reference pulse by a constant time duration and charging said second storage capacitor during said constant time duration.

5. A phase detector as claimed in claim 1, wherein said first and second storage capacitors have equal capacitance values.

6. A phase detector comprising:
   a first storage capacitor;
   first charge/discharge means for charging said first storage capacitor with a first constant current for a duration corresponding to a phase difference between an input pulse and a reference pulse and discharging said first storage capacitor;
   first sample-and-hold means for sampling a voltage developed in said first storage capacitor, said sampled voltage representing a phase difference between said input pulse and said reference pulse;
   a second storage capacitor;
   second charge/discharge means for charging said second storage capacitor with a second constant current for a fixed time interval and discharging said second storage capacitor;
   second sample-and-hold means for sampling a voltage developed in said second storage capacitor;
   current setting means including a resistive element, said current setting means being connected to said first charge/discharge means and said second charge/discharge means for determining said first and second constant currents; and
   differential integrator means for differentially integrating the voltage sampled by said second sample-and-hold means with respect to a reference voltage and controlling said current setting means with the differentially integrated voltage;

wherein said current setting means includes a first and a second transistor, and each of said first and second charge/discharge means includes a transistor, the transistors of the first and second charge/discharge means are connected in a current mirror relationship with the first transistor of the current setting means, the first and second transistors of the current setting means being connected in series to said resistive element, said second transistor being connected to be responsive to said differentially integrated voltage.

7. A phase detector comprising:

a first storage capacitor;

first charge/discharge means for charging said first storage capacitor with a first constant current for a duration corresponding to a phase difference between an input pulse and a reference pulse and discharging said first storage capacitor;

first sample-and-hold means for sampling a voltage developed in said first storage capacitor, said sampled voltage representing a phase difference between said input pulse and said reference pulse;

a second storage capacitor;

second charge/discharge means for charging said second storage capacitor with a second constant current for a fixed time interval and discharging said second storage capacitor;

second sample-and-hold means for sampling a voltage developed in said second storage capacitor;

current setting means including a resistive element, said current setting means being connected to said first charge/discharge means and said second charge/discharge means for determining said first and second constant currents; and differential integrator means for differentially integrating the voltage sampled by said second sample-and-hold means with respect to a reference voltage and controlling said current setting means with the differentially integrated voltage;

wherein said second charge/discharge means includes means for deriving a second reference pulse delayed with respect to the first-mentioned reference pulse by a constant time duration and charging said second storage capacitor during said constant time duration.

* * * * *

UNITED STATES PATENT AND TRADEMARK OFFICE
CERTIFICATE OF CORRECTION

PATENT NO. : 5,331,230
DATED : Jul. 19, 1994
INVENTOR(S) : Masaki ICHIHARA

It is certified that error(s) appears in the above-identified patent and that said Letters Patent is hereby corrected as shown below:

On the title page, in Item [73], please delete "Nec Corporation" and insert --NEC Corporation--.

Signed and Sealed this

Twenty-eight Day of February, 1995

Attest:

BRUCE LEHMAN

Attesting Officer

Commissioner of Patents and Trademarks